United States Patent
Xie et al.

(10) Patent No.: US 11,101,217 B2
(45) Date of Patent: Aug. 24, 2021

(54) BURIED POWER RAIL FOR TRANSISTOR DEVICES

(71) Applicant: INTERNATIONAL BUSINESS MACHINES CORPORATION, Armonk, NY (US)

(72) Inventors: Ruilong Xie, Niskayuna, NY (US); Alexander Reznicek, Troy, NY (US); Junli Wang, Slingerlands, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 27 days.

(21) Appl. No.: 16/455,148

(22) Filed: Jun. 27, 2019

(65) Prior Publication Data
US 2020/0411436 A1    Dec. 31, 2020

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/02126* (2013.01); *H01L 21/02167* (2013.01);
(Continued)

(58) Field of Classification Search
CPC ......... H01L 23/5286; H01L 21/823481; H01L 21/76877; H01L 21/02126;
(Continued)

(56) References Cited

U.S. PATENT DOCUMENTS 5,909,618 A    6/1999   Forbes et al.
7,002,187 B1   2/2006   Husher
(Continued)

FOREIGN PATENT DOCUMENTS

EP    3324436 A1    5/2018
WO    WO03107430 A1    12/2003

OTHER PUBLICATIONS

Debacker et al., "DTCO exploration for efficient standard cell power rails", ResearchGate, Mar. 2018, 8 pages.

*Primary Examiner* — Nduka E Ojeh
*Assistant Examiner* — Gardner W. S. Swan
(74) *Attorney, Agent, or Firm* — Tutunjian & Bitetto, P.C.; Jeffrey S. LaBaw

(57) ABSTRACT

A method of forming a buried power rail for transistor devices is provided. The method includes forming an adjacent pair of transistor devices on a substrate, wherein the adjacent pair of transistor devices is separated by a gap distance, $G_D$, filled by a fill layer. The method further includes forming a dielectric plate between the adjacent pair of transistor devices by removing a portion of the fill layer, and forming a protective liner on each of the adjacent pair of transistor devices. The method further includes forming a sidewall spacer on each of the protective liners, and forming a buried power rail on the dielectric plate and between the sidewall spacers. The method further includes removing a portion of the sidewall spacers above the buried power rail to form spacer bars on the dielectric plate, and forming a power rail cap on the buried power rail and spacer bars.

19 Claims, 17 Drawing Sheets

(51) Int. Cl.
*H01L 29/06* (2006.01)
*H01L 21/8234* (2006.01)
*H01L 21/311* (2006.01)
*H01L 21/02* (2006.01)
*H01L 27/088* (2006.01)
*H01L 21/285* (2006.01)
*H01L 21/321* (2006.01)

(52) U.S. Cl.
CPC .. *H01L 21/31116* (2013.01); *H01L 21/76802* (2013.01); *H01L 21/76877* (2013.01); *H01L 21/823418* (2013.01); *H01L 21/823431* (2013.01); *H01L 21/823475* (2013.01); *H01L 21/823481* (2013.01); *H01L 27/0886* (2013.01); *H01L 29/0673* (2013.01); *H01L 21/0228* (2013.01); *H01L 21/02274* (2013.01); *H01L 21/28556* (2013.01); *H01L 21/3212* (2013.01); *H01L 21/7684* (2013.01)

(58) Field of Classification Search
CPC ......... H01L 21/76802; H01L 21/31116; H01L 21/02167; H01L 21/823418; H01L 21/823431; H01L 21/823475; H01L 21/02274; H01L 21/0228; H01L 21/28556; H01L 21/3212; H01L 21/7684; H01L 27/0886; H01L 29/0673
See application file for complete search history.

(56) References Cited

U.S. PATENT DOCUMENTS

| | | | |
|---|---|---|---|
| 9,105,466 | B2 | 8/2015 | Lu et al. |
| 9,570,395 | B1 | 2/2017 | Sengupta et al. |
| 9,865,544 | B2 | 1/2018 | Jung |
| 2018/0269152 | A1 | 9/2018 | Sengupta et al. |
| 2018/0294267 | A1 | 10/2018 | Licausi et al. |
| 2018/0374791 | A1 | 12/2018 | Smith et al. |
| 2019/0058036 | A1 | 2/2019 | Smith et al. |
| 2019/0295942 | A1* | 9/2019 | Badaroglu ........ H01L 23/53209 |
| 2020/0135578 | A1* | 4/2020 | Ching ................ H01L 27/0886 |
| 2020/0219813 | A1* | 7/2020 | Paul ................. H01L 21/76895 |

* cited by examiner

BURIED POWER RAIL FOR TRANSISTOR DEVICES

BACKGROUND

The present invention generally relates to buried power rails, and more particularly to buried power rails for fin and nanosheet type transistor devices.

SUMMARY

In accordance with an embodiment of the present invention, a method of forming a buried power rail for transistor devices is provided. The method includes forming an adjacent pair of transistor devices on a substrate, wherein the adjacent pair of transistor devices is separated by a gap distance, $G_D$, filled by a fill layer. The method further includes forming a dielectric plate between the adjacent pair of transistor devices by removing a portion of the fill layer, and forming a protective liner on each of the adjacent pair of transistor devices. The method further includes forming a sidewall spacer on each of the protective liners, and forming a buried power rail on the dielectric plate and between the sidewall spacers. The method further includes removing a portion of the sidewall spacers above the buried power rail to form spacer bars on the dielectric plate, and forming a power rail cap on the buried power rail and spacer bars.

In accordance with another embodiment of the present invention, a method of forming a buried power rail for transistor devices is provided. The method includes forming an adjacent pair of transistor devices on a substrate, wherein the adjacent pair of transistor devices is separated by a gap distance, $G_D$, filled by a fill layer. The method further includes forming a dielectric plate between the adjacent pair of transistor devices by removing a portion of the fill layer, and forming a protective liner on each of the adjacent pair of transistor devices. The method further includes forming a sidewall spacer on each of the protective liners, and forming a buried power rail on the dielectric plate and between the sidewall spacers. The method further includes removing a portion of the sidewall spacers above the buried power rail to form spacer bars on the dielectric plate, and forming a power rail cap on the buried power rail and spacer bars. The method further includes forming a dielectric slab on the power rail cap, and forming a source/drain on each of the adjacent pair of transistor devices.

In accordance with yet another embodiment of the present invention, an adjacent pair of transistor devices is provided. The transistor devices include a first transistor device and a second transistor device adjacent on a substrate, wherein the adjacent pair of transistor devices is separated by a gap distance, $G_D$. The transistor devices further include a dielectric plate between the adjacent pair of transistor devices, and a protective liner segment on each of the adjacent pair of transistor devices. The transistor devices further include a spacer bar on the dielectric plate and each of the protective liner segments, and a buried power rail on the dielectric plate and between the spacer bars. The transistor devices further include a power rail cap on the buried power rail and spacer bars, and a dielectric section on a portion of the power rail cap.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a buried power rail between adjacent device cells that provides electricity to a transistor device in at least one of the device cells. The buried power rail can be positioned below a device channel and gate structure of a fin field effect transistor or below the source/drain and semiconductor channel nanosheets of a nanosheet transistor device without shorting to the semiconductor fin or neighboring source/drain.

Embodiments of the present invention provide an electrical interconnect structure that includes a T-shaped buried power rail with a wider top landing region formed by a power rail cap that is separated from the substrate and/or a device pillar by a dielectric protective liner segment. An additional dielectric spacer bar can be underneath the power rail cap between the buried power rail and the substrate and/or a device pillar to decrease parasitic capacitance. The dielectric spacer bar can have a lower dielectric constant, K, value to further reduce parasitic capacitance.

Embodiments of the present invention provide a method of forming a buried power rail between adjacent device cells, that can be self-aligned to at least one of an adjacent pair of transistor devices. The buried power rail can be T-shaped with a power rail cap that is wider than the buried power rail, such that the larger landing region and intervening dielectric protective liner segment avoids electrical shorts and undersized or open electrical connections between a buried contact, source/drain, and buried power rail. The T-shaped power rail can allow the tip-to-tip distance, $G_C$, between conductive device contacts to source/drains on adjacent transistor devices to be increased.

Embodiments of the present invention provide a buried power rail instead of a via for electrical connection to a source/drain of a transistor device, where there is reduced concern for electrical shorts between a buried contact or buried power rail with the substrate or other device features. The buried power rail can have a T-shape to reduce the parasitic capacitance by increasing the thickness of at least a portion of an intervening dielectric.

Exemplary applications/uses to which the present invention can be applied include, but are not limited to: complementary metal-oxide-semiconductor (CMOS) device transistor device pairs, logic circuits, and memory circuits.

It is to be understood that aspects of the present invention will be described in terms of a given illustrative architecture; however, other architectures, structures, substrate materials and process features and steps can be varied within the scope of aspects of the present invention.

Figure 1:
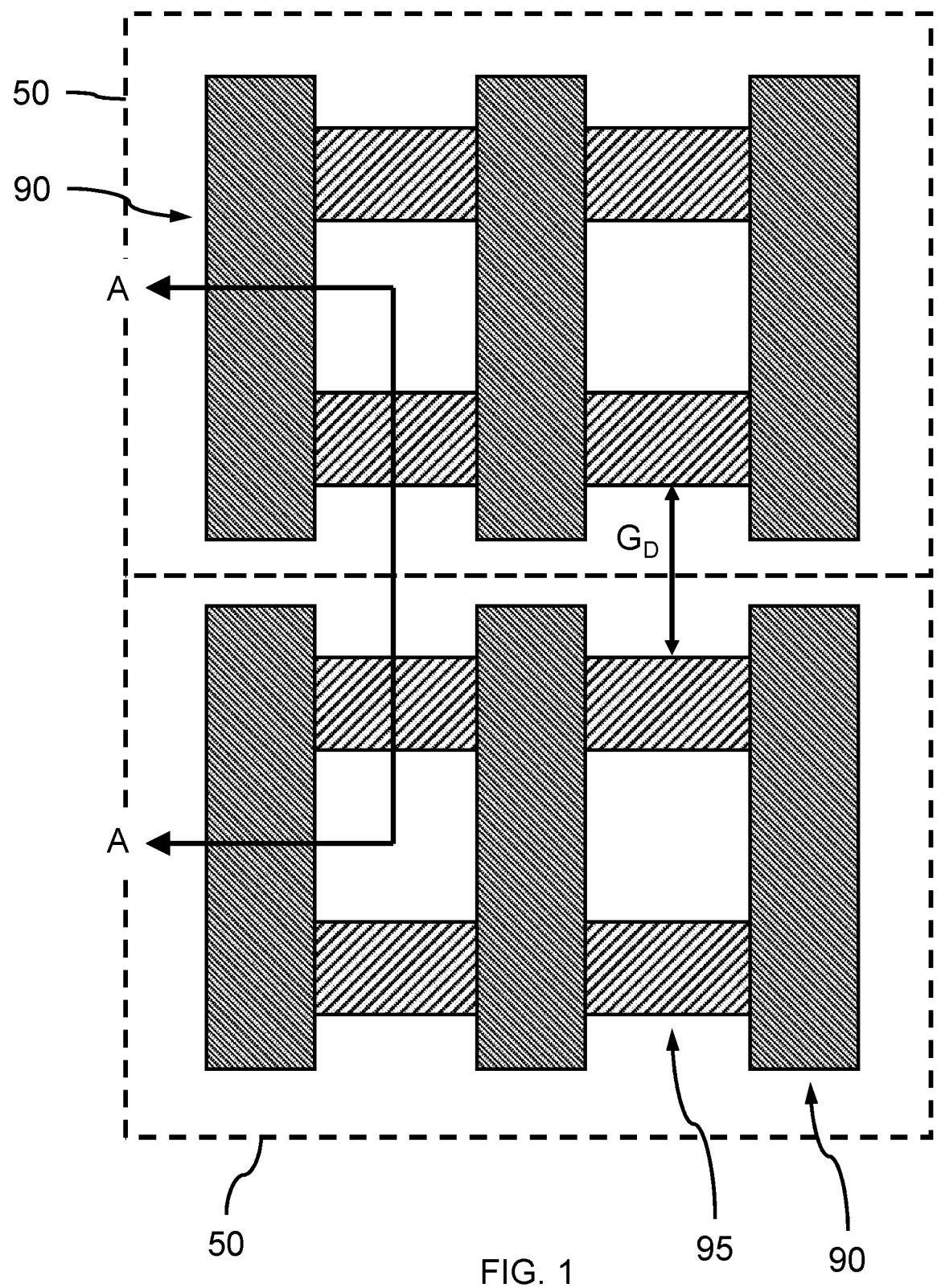
FIG. 1 is a top view showing adjacent device cells with gate structures across device channels, in accordance with an embodiment of the present invention.

Referring now to the drawings in which like numerals represent the same or similar elements and initially to FIG. 1, a top view of adjacent device cells with gate structures across device channels is shown, in accordance with an embodiment of the present invention.

In one or more embodiments, multiple device cells 50 can be adjacent to each other on a substrate, where the device cells can include transistor devices. The transistor devices can be horizontal type fin field effect transistors or horizontal transport nanosheet transistor devices, where the transistor devices can include gates 90 across portions of the fins or nanosheets. While the drawings depict nanosheet type devices, other transistor devices, including horizontal transport fin field effect transistors are also contemplated. The fins or nanosheets 95 and channel regions of the transistor devices in adjacent device cells 50 can be separated by a gap distance, $G_D$. The end walls of the gate structures can be separated by a distance less than the gap distance, $G_D$.

Figure 2:
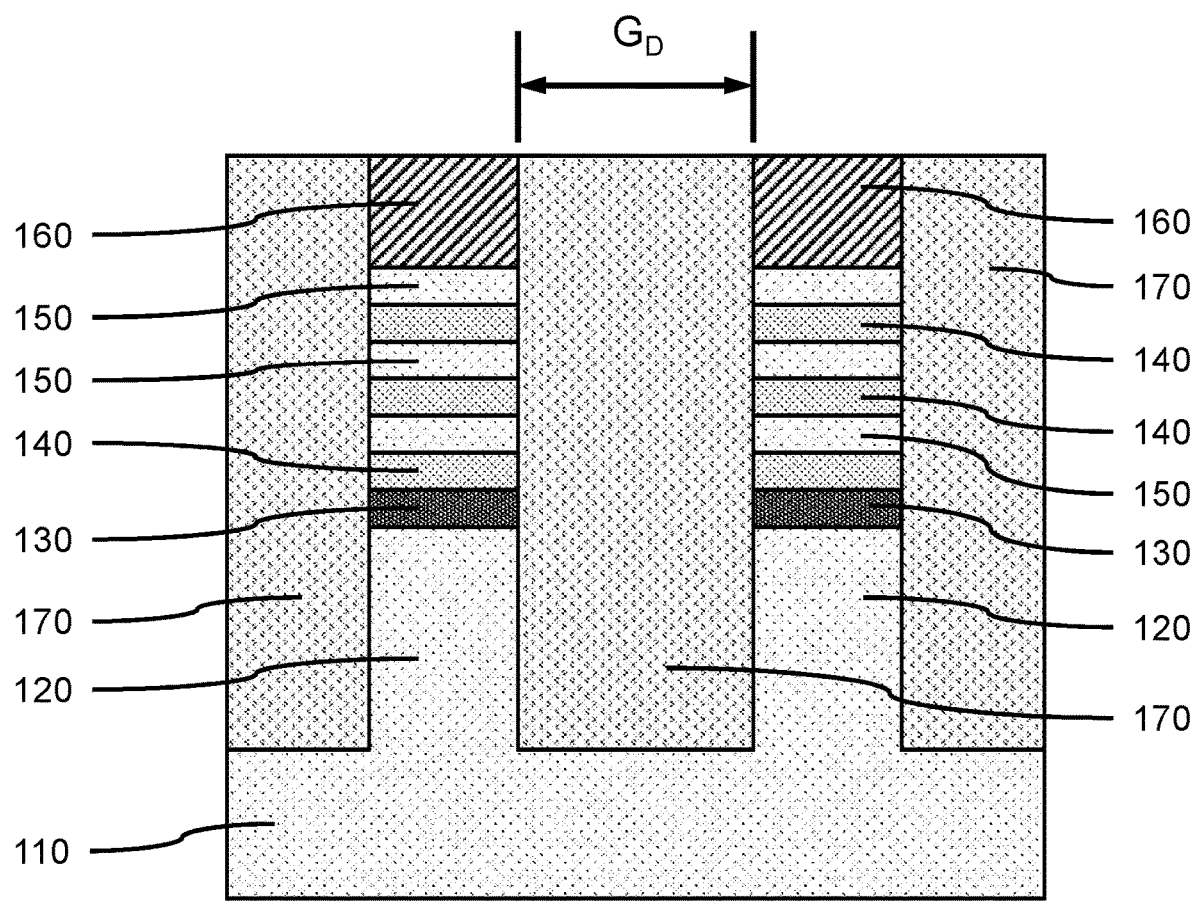
FIG. 2 is a cross-sectional side view showing an adjacent pair of nanosheet stacks on device pillars for adjacent device cells, in accordance with an embodiment of the present invention.

FIG. 2 is a cross-sectional side view showing an adjacent pair of nanosheet stacks on device pillars for adjacent device cells, in accordance with an embodiment of the present invention.

In one or more embodiments, a nanosheet stack, including alternating sacrificial nanosheets 140 and channel nanosheets 150 can be formed on a device pillar 120. A bottom sacrificial layer 130 can be formed between the device pillar 120 and the first sacrificial nanosheet 140, where the bottom sacrificial layer 130 can be a material different from the device pillar 120, sacrificial nanosheet 140, and channel nanosheet 150, to provide etch selectivity.

In various embodiments, the device pillar 120, bottom sacrificial layer 130, and alternating sacrificial nanosheets 140 and channel nanosheets 150 can be formed by a direct write process or sidewall image transfer patterning process, including, but not limited to, self-aligned single patterning (SASP), self-aligned double patterning (SADP), self-aligned triple patterning (SATP), or self-aligned quadruple patterning (SAQP). Direct write processes can utilize electron beam (EB), extreme ultraviolet (EUV), or x-ray lithography processes.

In various embodiments, a nanosheet stack template 160 can be formed on top of a nanosheet stack, as part of the sidewall image transfer patterning process, where the nanosheet stack template 160 can be a hardmask used for forming the nanosheet stack, device pillars 120 and bottom sacrificial layer 130 from layers on the substrate 110. The bottom sacrificial layer 130, sacrificial nanosheets 140, and channel nanosheets 150 can be formed from layer epitaxially grown on the substrate 110 or a previously grown epitaxial layer.

In various embodiments, the nanosheet stack template 160 can be a dielectric hardmask material including, but not limited to, silicon oxide (SiO), silicon nitride (SiN), silicon oxynitride (SiON), silicon boronitride (SiBN), silicon carbonitride (SiCN), silicon boro carbonitride (SiBCN), or a combination thereof.

In various embodiments, the device pillar 120 can be formed by patterning the substrate 110 below each of the nanosheet stack templates 160. The substrate 110 below the bottom sacrificial layer 130 can be etched back.

In one or more embodiments, a substrate 110 can be a semiconductor wafer or a semiconductor-on-insulator (SeOI) wafer, for example, a silicon-on-insulator (SOI) wafer.

In various embodiments, the substrate 110 can a semiconductor, including, but not limited to, silicon (Si), silicon-germanium (SiGe), silicon carbide (SiC), or germanium (Ge), where a surface of the semiconductor can be exposed. The substrate 110 can be a single crystal semiconductor, where the expose surface can provide a surface for epitaxial or heteroepitaxial growth of other semiconductor materials.

In various embodiments, the bottom sacrificial layer 130 can be a semiconductor material, including, but not limited to, silicon (Si), silicon-germanium (SiGe), carbon doped silicon (Si:C), or germanium (Ge), where the bottom sacrificial layer 130 can be a semiconductor material different from the materials of the sacrificial nanosheets 140 and channel nanosheets 150. The bottom sacrificial layer 130 can be silicon-germanium (SiGe) having a germanium concentration in a range of about 50 atomic percent (at. %) to about 80 at. %, or about 55 at. % to about 65 at. %, or about 60 at. %, although other concentrations are also contemplated.

In various embodiments, the sacrificial nanosheets 140 can be a semiconductor material, including, but not limited to, silicon (Si), silicon-germanium (SiGe), silicon carbide (SiC), carbon-doped silicon (Si:C), or germanium (Ge), where the sacrificial nanosheets 140 can be a semiconductor material different from the materials of the bottom sacrificial layer 130 and channel nanosheets 150 to provide etch selectivity. The sacrificial nanosheets 140 can be silicon-germanium (SiGe) having a germanium concentration in a range of about 20 atomic percent (at. %) to about 40 at. %, or about 25 at. % to about 35 at. %, or about 30 at. %, although other concentrations are also contemplated.

In various embodiments, the channel nanosheets 150 can be a semiconductor material, including, but not limited to, silicon (Si), silicon-germanium (SiGe), silicon carbide (SiC), carbon-doped silicon (Si:C), or germanium (Ge), where the channel nanosheets 150 can be a semiconductor material different from the materials of the bottom sacrificial layer 130 and sacrificial nanosheets 140 to provide etch selectivity. The channel nanosheets 150 can be single crystal silicon (Si) or.

In a non-limiting exemplary embodiment, the bottom sacrificial layer 130 can be silicon-germanium (SiGe) having a germanium content greater than the germanium content of silicon-germanium (SiGe) sacrificial nanosheets 140, and the channel nanosheets 150 can be single crystal silicon (Si) or germanium (Ge).

In various embodiments, a stack of a device pillar 120, bottom sacrificial layer 130, sacrificial nanosheet(s) 140, and channel nanosheet(s) 150 can be separated from an adjacent stack of a device pillar 120, bottom sacrificial layer 130, sacrificial nanosheet(s) 140, and channel nanosheet(s) 150 in a different device cell 50 by a gap distance, $G_D$.

In various embodiments, the gap distance, $G_D$, can be in a range of about 30 nanometers (nm) to about 150 nm, or about 40 nm to about 70 nm, or about 55 nm, although other distances are also contemplated. The gap distance, $G_D$, can be determined by the pitch and width of metal lines in the first metallization layer.

In one or more embodiments, a fill layer 170 can be formed on the nanosheet stacks and device pillars 120, where the fill layer 170 can be formed by a blanket deposition, for example, chemical vapor deposition (CVD), plasma enhanced CVD (PECVD), and/or a spin-on process, that fill in the spaces between adjacent nanosheet stacks.

In various embodiments, the fill layer 170 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof. A low-k dielectric material can be, for example, fluorine doped silicon oxide (SiO:F), carbon doped silicon oxide (SiO:C), hydrogen silsesquioxane (HSQ), methylsilsesquioxane (MSQ), tetraethoxysilane (TEOS), and combinations thereof.

Figure 3:
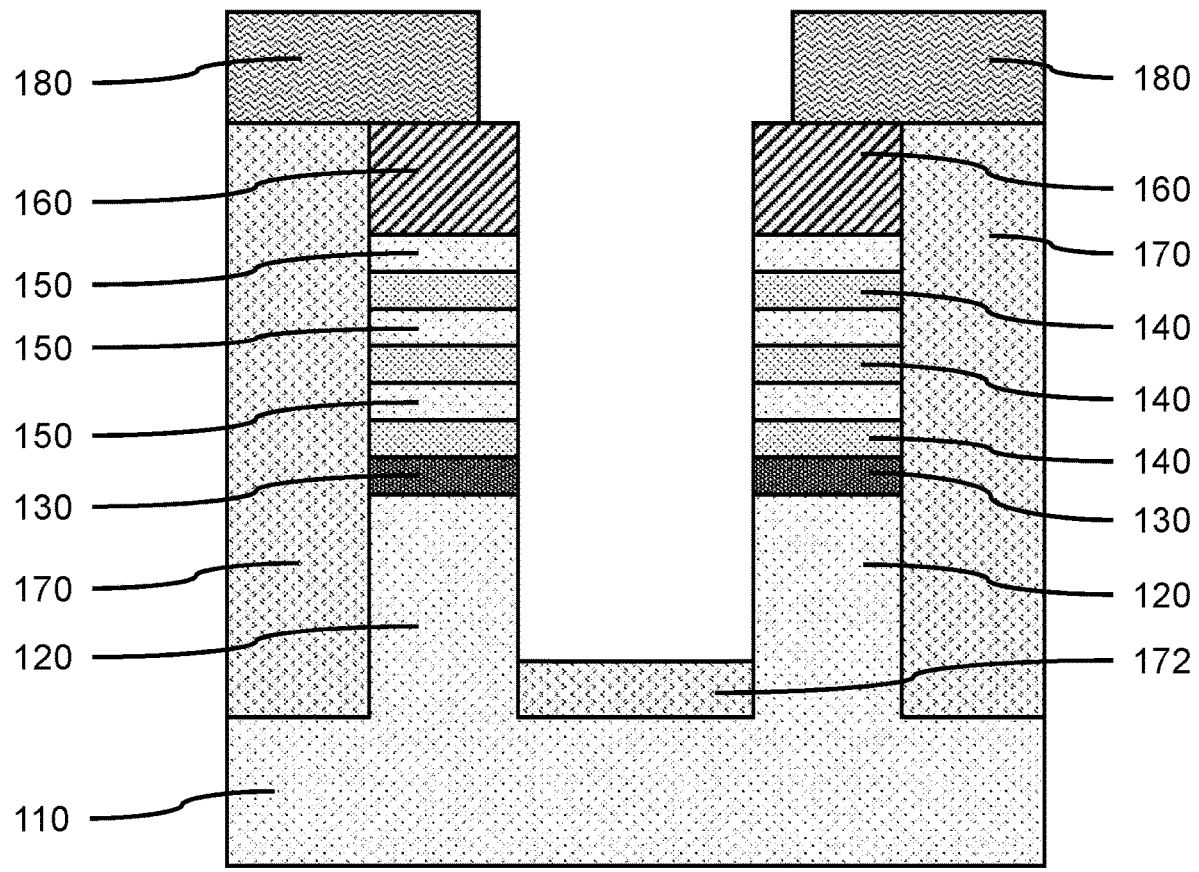
FIG. 3 is a cross-sectional side view showing a portion of a fill layer removed from between the adjacent pair of nanosheet stacks to form a dielectric plate, in accordance with an embodiment of the present invention.

FIG. 3 is a cross-sectional side view showing a portion of a fill layer removed from between the adjacent pair of nanosheet stacks to form a dielectric plate, in accordance with an embodiment of the present invention.

In one or more embodiments, a portion of the fill layer 170 and nanosheet stack templates 160 can be covered by masking blocks 180, where the masking blocks 180 can be formed by patterning a masking layer using lithographic techniques and etching. The masking blocks 180 can be positioned to leave a portion of the fill layer 170 between two adjacent device cells 50 exposed. The etching process of the fill 170 can be selective between hardmask layer 180 and fill layer 170.

In various embodiments, the masking layer and masking block(s) 180 can be a dielectric hardmask material including, but not limited to, silicon oxide (SiO), silicon nitride (SiN), silicon oxynitride (SiON), silicon boronitride (SiBN), silicon carbonitride (SiCN), silicon boro carbonitride (SiBCN), or a combination thereof.

In one or more embodiments, a portion of the fill layer 170 between adjacent nanosheet stacks can be removed using a selective isotropic etch, where a portion of the fill layer 170 can remain on the substrate, as a dielectric plate 172. Removal of the portion of the fill layer 170 can expose portions of the device pillars 120, bottom sacrificial layers 130, alternating sacrificial nanosheets 140 and channel nanosheets 150, and nanosheet stack template 160 of two different transistor devices of different device cells.

In other embodiments, removal of the portion of the fill layer 170 can expose portions of two adjacent fins of two different transistor devices. The fins can be formed from the substrate and extend upwards to the masking blocks 180.

In various embodiments, the dielectric plate 172 can have a thickness in a range of about 8 nm to about 60 nm, about 15 nm to about 40 nm, or about 25 nm to about 30 nm, although other thicknesses are also contemplated.

Figure 4:
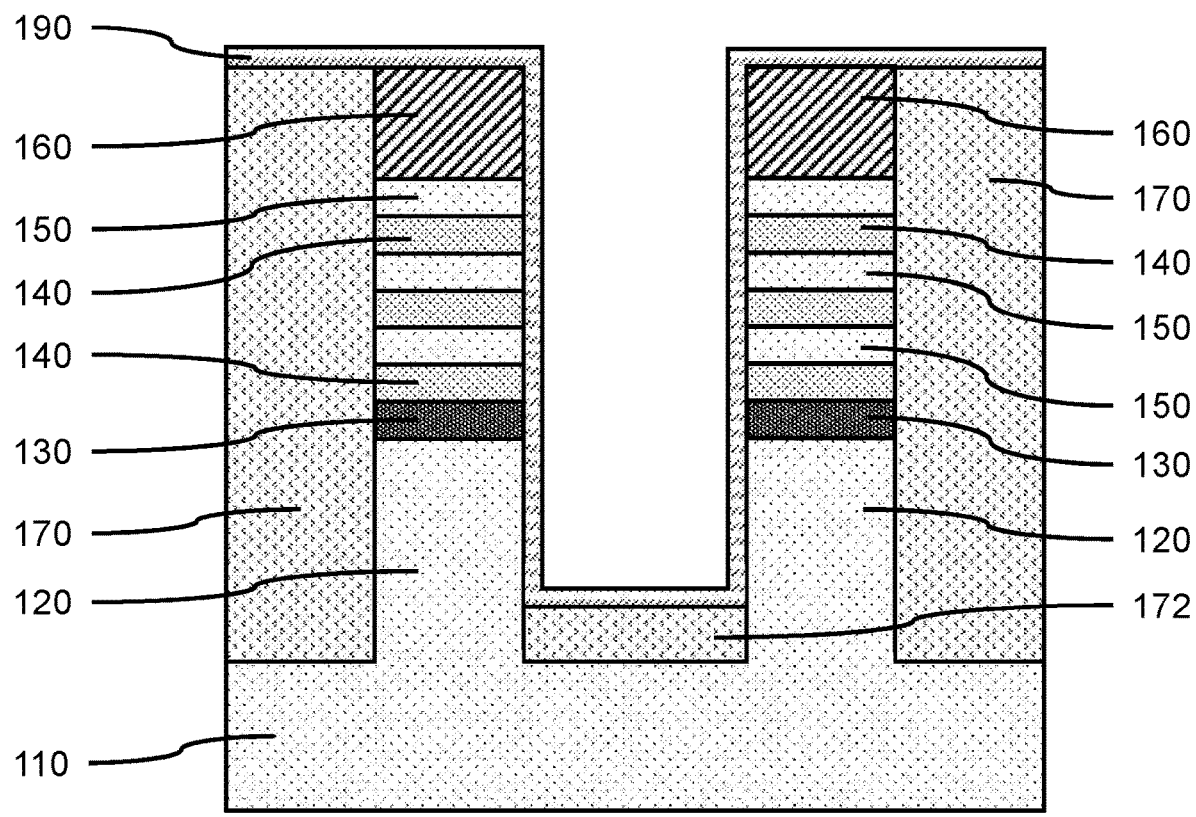
FIG. 4 is a cross-sectional side view showing a protective layer formed on the adjacent pair of nanosheet stacks and remaining portions of the intervening fill layer, in accordance with an embodiment of the present invention.

FIG. 4 is a cross-sectional side view showing a protective layer formed on the adjacent pair of nanosheet stacks and remaining portions of the intervening fill layer, in accordance with an embodiment of the present invention.

In one or more embodiments, a protective layer 190 can be formed on the adjacent pair of transistor devices having nanosheet stacks and the remaining portion of the intervening fill layer, including the dielectric plate 172. The protective layer 190 can be formed by a conformal deposition, for example, atomic layer deposition (ALD) or plasma enhanced ALD (PEALD), where the protective layer 190 can cover exposed sidewalls of the device pillars 120, bottom sacrificial layers 130, alternating sacrificial nanosheets 140 and channel nanosheets 150, and nanosheet stack templates 160.

In various embodiments, the protective layer 190 can have a thickness in a range of about 3 nm to about 15 nm, or about 4 nm to about 8 nm, or about 6 nm, although other thicknesses are also contemplated. The protective layer 190 can be sufficiently thick to electrically isolate a buried power rail from the adjacent device pillars 120

In various embodiments, the protective layer 190 can be a dielectric material including, but not limited to, silicon carbide (SiC), silicon oxycarbide (SiOC), or a combination thereof. The protective layer 190 can be a different material from bottom sacrificial layers 130, alternating sacrificial nanosheets 140 and channel nanosheets 150, and nanosheet stack templates 160.

Figure 5:
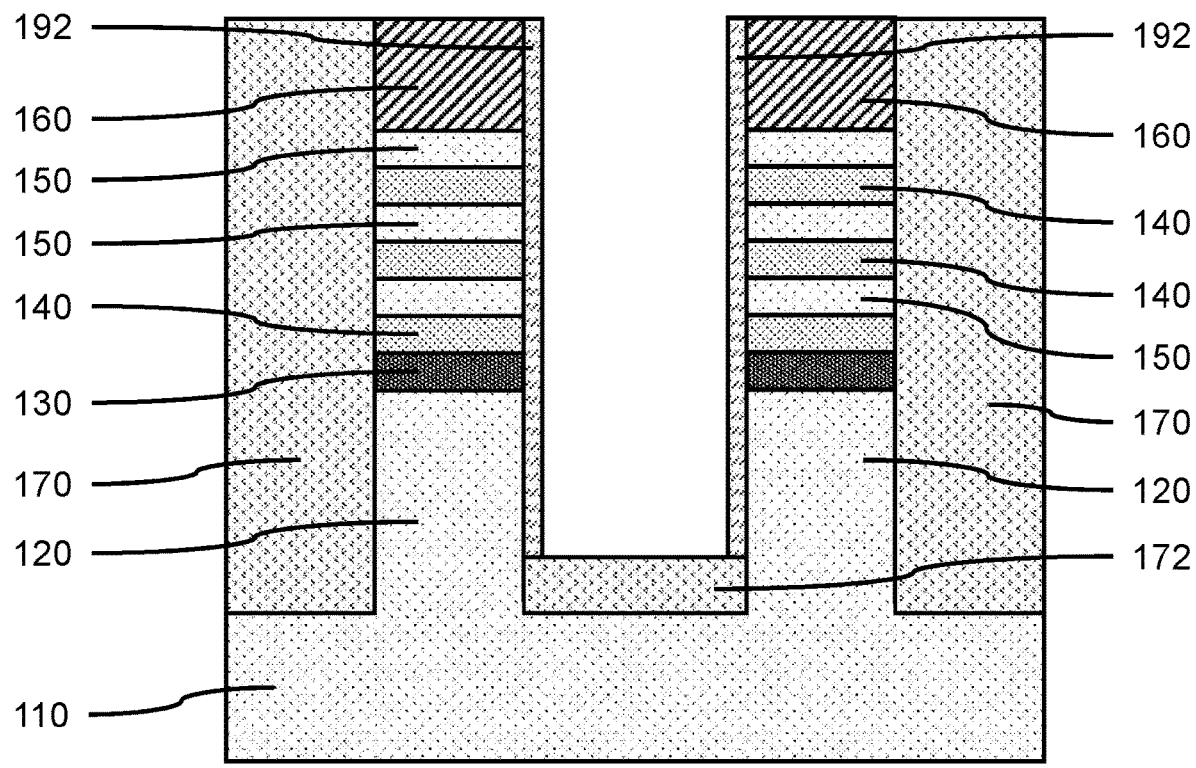
FIG. 5 is a cross-sectional side view showing a portion of the protective layer removed to form a protective liner on each of the nanosheet stacks, in accordance with an embodiment of the present invention.

FIG. 5 is a cross-sectional side view showing a portion of the protective layer removed to form a protective liner on each of the nanosheet stacks, in accordance with an embodiment of the present invention.

In one or more embodiments, exposed portions of the protective layer 190 can be removed using a selective, directional etch, for example, a reactive ion etch (RIE), where portions of the protective layer 190 remain on the sidewalls of the device pillars 120, bottom sacrificial layers 130, alternating sacrificial nanosheets 140 and channel nanosheets 150, and nanosheet stack templates 160, as a protective liners 192. The portions of the protective layer 190 approximately parallel to the direction of the etch can remain on the surfaces, whereas the portions of the protective layer 190 approximately perpendicular to the etch can be removed exposing the dielectric plate 172.

Figure 6:
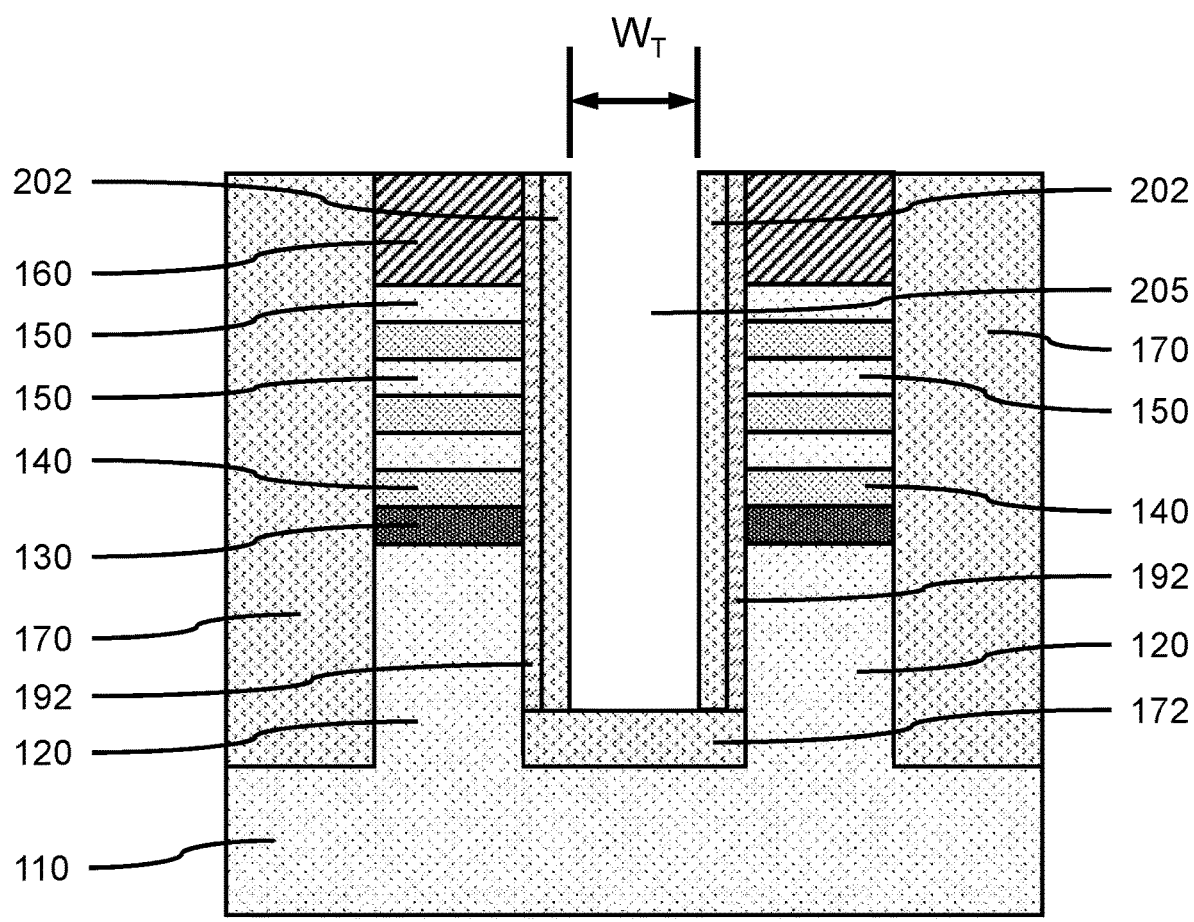
FIG. 6 is a cross-sectional side view showing sidewall spacers formed on the protective liners to form a power rail trench between the adjacent device cells, in accordance with an embodiment of the present invention.

FIG. 6 is a cross-sectional side view showing sidewall spacers formed on the protective liners to form a power rail trench between the adjacent device cells, in accordance with an embodiment of the present invention.

In one or more embodiments, a sidewall spacer layer can be formed on the protective liners 192, dielectric plate 172, nanosheet stack template 160, and fill layer 170, where the sidewall spacer layer can be formed by a conformal deposition (e.g., ALD, PEALD). Exposed portions of the sidewall spacer layer can be removed using a selective, directional etch, for example, a reactive ion etch (RIE), to form sidewall spacers 202 on the protective liners 192.

In various embodiments, the sidewall spacer layer and sidewall spacers 202 can have a thickness in a range of about 3 nm to about 15 nm, about 4 nm to about 8 nm, or about 6 nm, although other thicknesses are also contemplated. The sidewall spacer layer and sidewall spacers 202 can be sufficiently thick to reduce the capacitance between the substrate 110 and device pillar 120 and a buried power rail.

In various embodiments, the sidewall spacer layer and sidewall spacers 202 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof. The sidewall spacers 202 can be a different material from the protective liners 192, dielectric plate 172, fill layer 170, and nanosheet stack templates 160 to provide selective removal.

In various embodiments, the space between the sidewall spacers 202 and dielectric plate 172 can form a power rail trench 205 between the adjacent device cells, where the power rail trench 205 can have a width, $W_T$, in a range of about 15 nm to about 100 nm, or about 20 nm to about 40 nm, although other widths are also contemplates. The width, $W_T$, of the power rail trench 205 can be sufficiently wide, such that $W_T$ multiplied by the depth of the final power rail provides enough of a metal cross-sectional area to conduct a predetermined current at a predetermined voltage.

Figure 7:
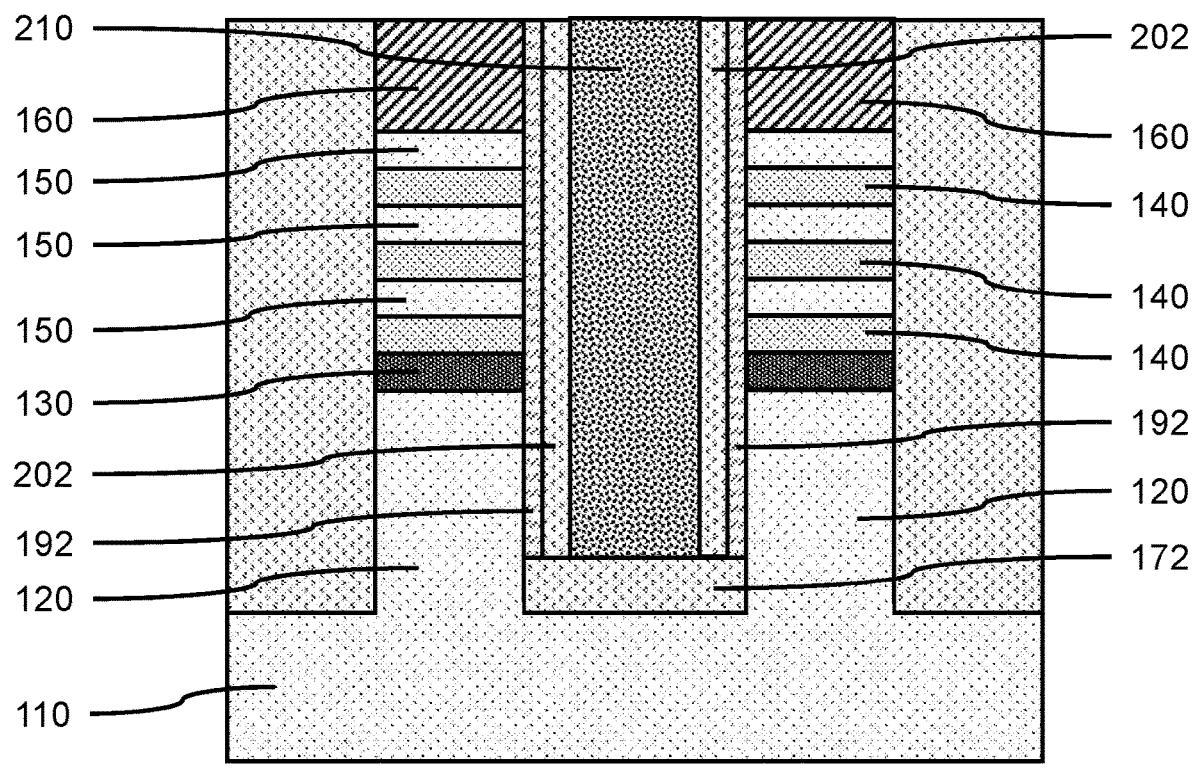
FIG. 7 is a cross-sectional side view showing a conductive fill formed on the dielectric plate between the sidewall spacers, in accordance with an embodiment of the present invention.

FIG. 7 is a cross-sectional side view showing a conductive fill formed on the dielectric plate between the sidewall spacers, in accordance with an embodiment of the present invention.

In one or more embodiments, a conductive fill 210 can be formed in the power rail trench 205 between the sidewall spacers 202. The conductive fill 210 can be formed by a conformal deposition (e.g., ALD, PEALD) a blanket deposition (e.g., CVD, PECVD, metal-organic CVD (MOCVD)), or a combination thereof. The conductive fill 210 can fill up the power rail trench 205, and a chemical-mechanical polishing (CMP) can be used to remove excess conductive material.

In various embodiments, the conductive fill 210 can be any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube(s), conductive carbon, graphene, or any suitable combination of these materials. The conductive material may further comprise dopants that are incorporated during or after deposition.

Figure 8:
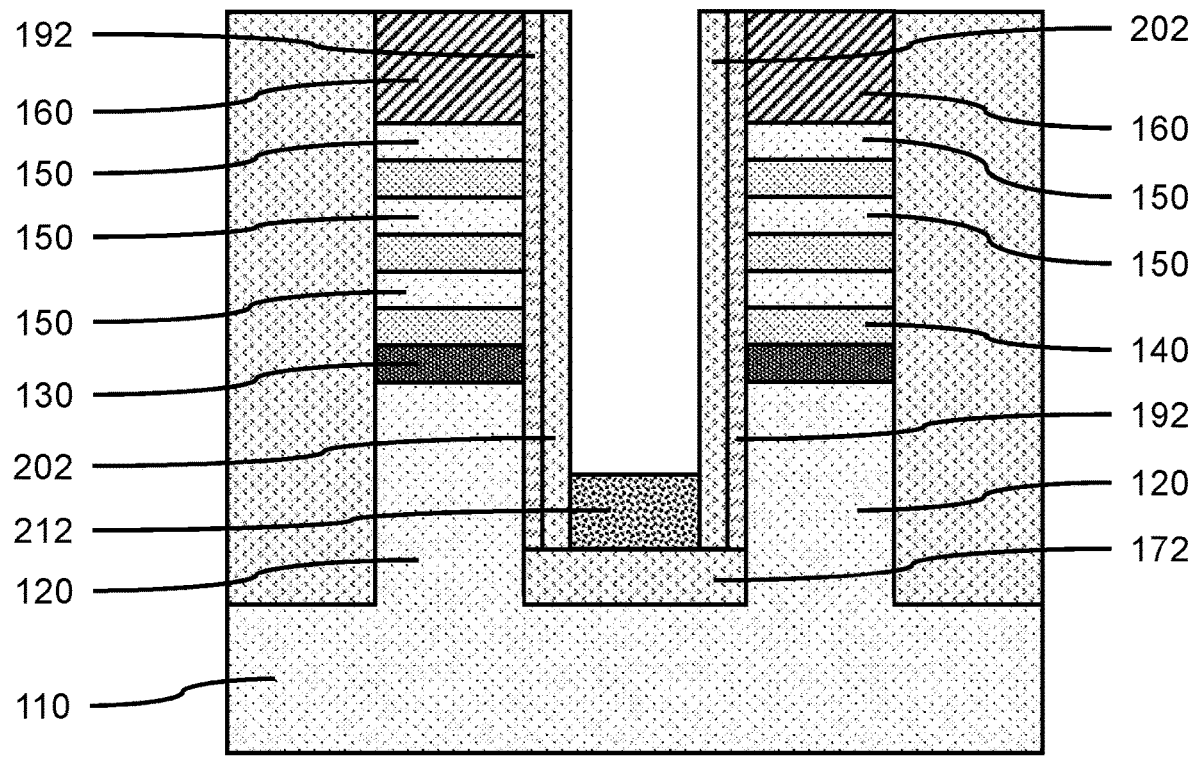
FIG. 8 is a cross-sectional side view showing a portion of the conductive fill removed to form a buried power rail between the adjacent device cells, in accordance with an embodiment of the present invention.

FIG. 8 is a cross-sectional side view showing a portion of the conductive fill removed to form a buried power rail between the adjacent device cells, in accordance with an embodiment of the present invention.

In one or more embodiments, a portion of the conductive fill 210 can be removed using a selective isotropic etch to form a buried power rail 212 between the adjacent device cells. The sidewall spacers 202 and protective liners 192 can physically and electrically separate the buried power rail 212 from the device pillars 120, where the combined thickness of the sidewall spacers 202 and protective liners 192 can reduce the capacitance between the buried power rail 212 and the device pillars 120. The dielectric plate 172 can physically separate and electrically isolate the buried power rail 212 from the substrate 110.

In various embodiments, the buried power rail 212 has a height in a range of about 20 nm to about 300 nm, or about 100 nm to about 250 nm, or about 150 nm to about 200 nm, although other heights are contemplated. The width, $W_T$, and height of the buried power rail 212 can be sufficient to carry the current for the device(s).

Figure 9:
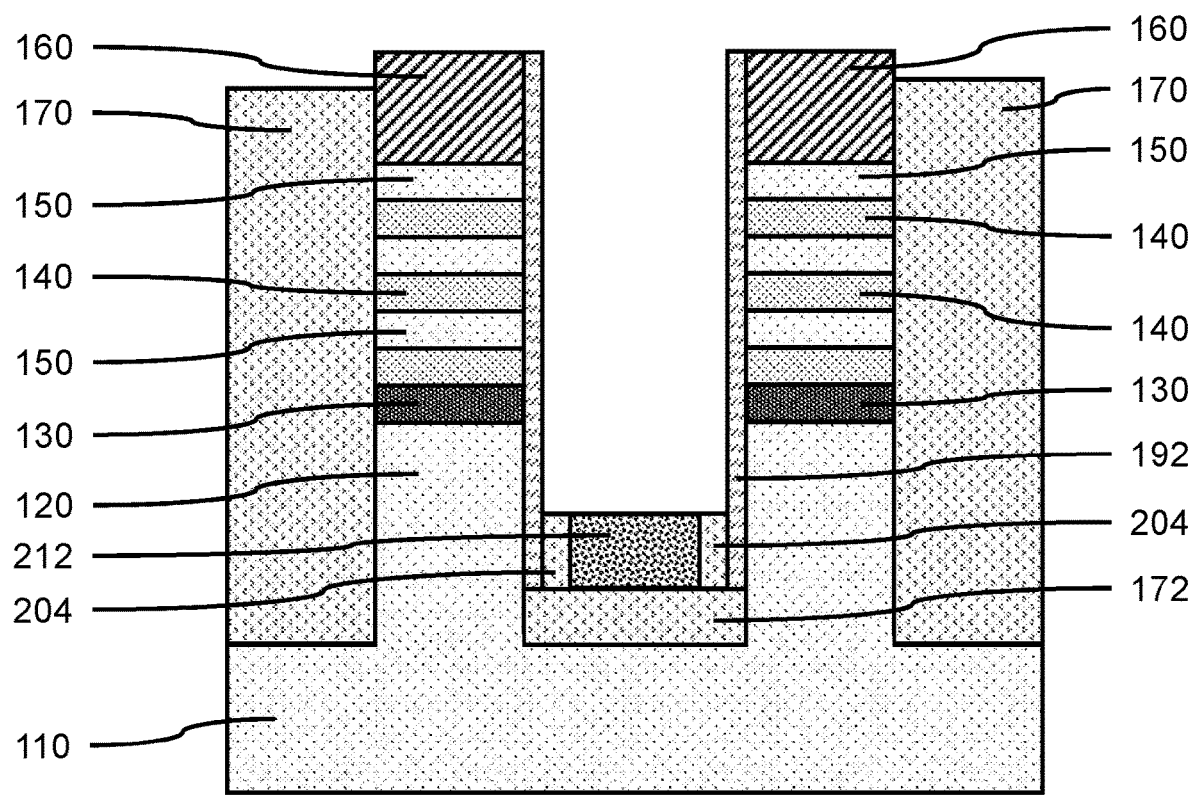
FIG. 9 is a cross-sectional side view showing the exposed portion of the sidewall spacers removed to form spacer bars between the buried power rail and device pillars, in accordance with an embodiment of the present invention.

FIG. 9 is a cross-sectional side view showing the exposed portion of the sidewall spacers removed to form spacer bars between the buried power rail and device pillars, in accordance with an embodiment of the present invention.

In one or more embodiments, the exposed portion of the sidewall spacers 202 can be removed to form spacer bars 204 between the buried power rail 212 and device pillars 120. The exposed portion of the sidewall spacers 202 can be removed using a selective isotropic etch (e.g., wet chemical etch or dry plasma etch), where the spacer bars 204 can have approximately the same height as the buried power rail 212. Where the sidewall spacers 202 are the same material as the fill layer 170, a thickness of the fill layer 170 approximately equal to the thickness of the sidewall spacers 202 can also be removed, such that the height of the exposed fill layer 170 is reduced.

Figure 10:
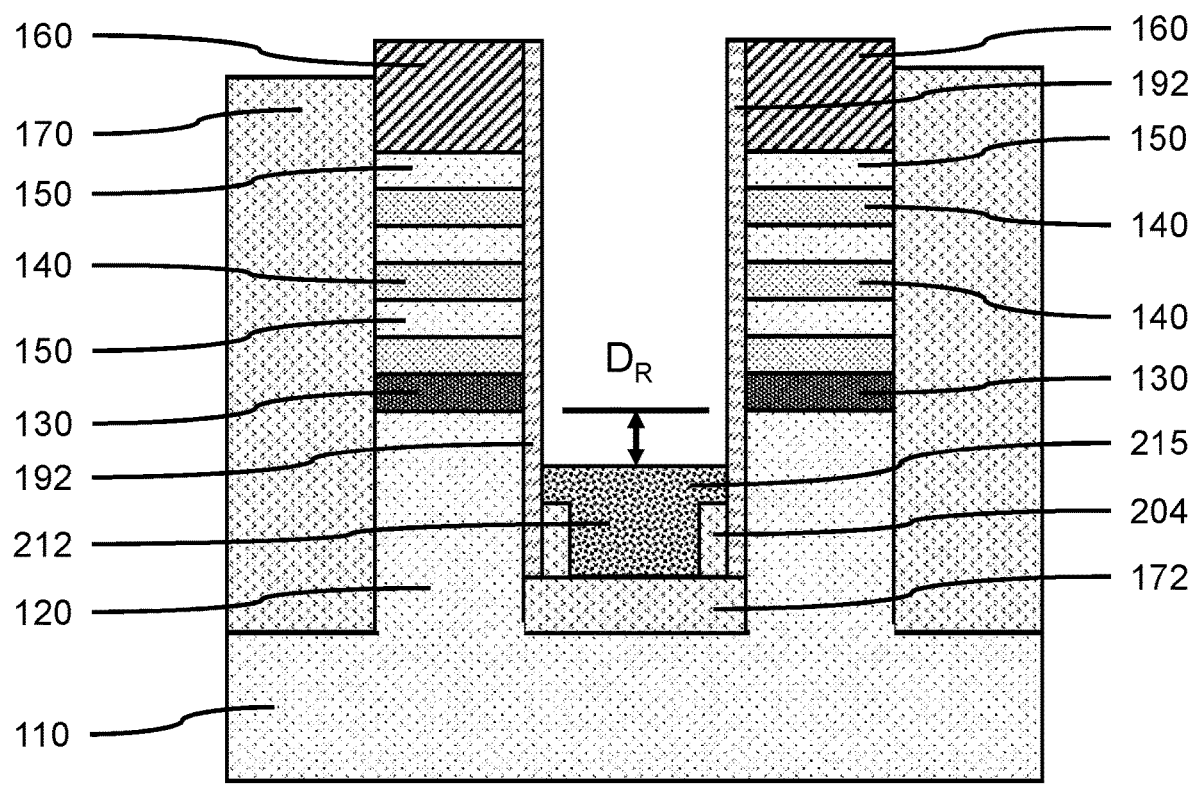
FIG. 10 is a cross-sectional side view showing a power rail cap formed on the buried power rail and spacer bars, in accordance with an embodiment of the present invention.

FIG. 10 is a cross-sectional side view showing a power rail cap formed on the buried power rail and spacer bars, in accordance with an embodiment of the present invention.

In one or more embodiments, a power rail cap 215 can be formed on the buried power rail 212 and spacer bars 204, where the power rail cap 215 can be formed by a selective metal growth over the material of the buried power rail 212, or by depositing metals (e.g., metal-organic chemical vapor deposition (MOCVD)) to fill the entire trench followed by a selective etching back.

In various embodiments, the power rail cap 215 can have a height above the top surface of the buried power rail 212, where the power rail cap 215 can have a height in a range of about 3 nm to about 50 nm, about 6 nm to about 20 nm, or about 10 nm to about 15 nm, although other heights are contemplated. The height of the power rail cap 215 can be sufficient to survive the buried contact etch landing process. The top surface of the power rail cap 215 can be below the interface of the bottom sacrificial layer 130 with the device pillars 120 by a recess distance, $D_R$, of about 10 nm to about 30 nm, or about 20 nm, to allow an isolation region formation over the power rail cap.

Figure 11:
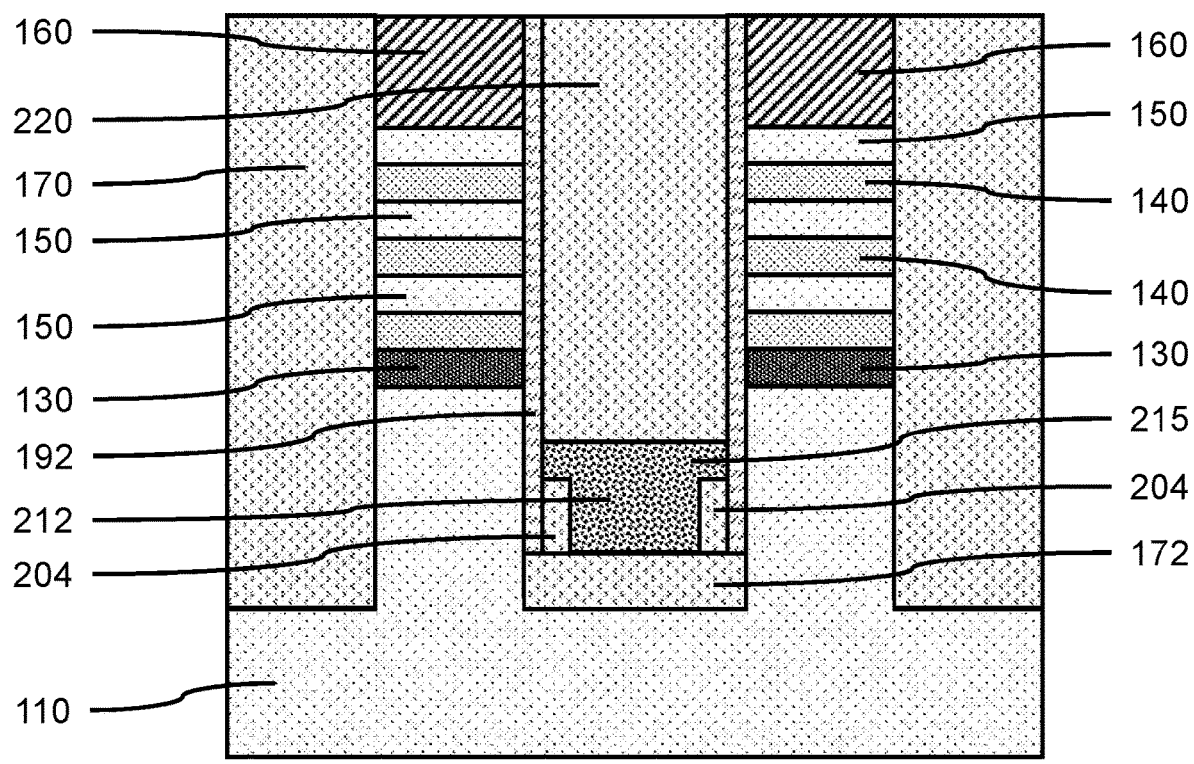
FIG. 11 is a cross-sectional side view showing a dielectric plug layer formed on the power rail cap between the protective liners and on the reduced height portions of the fill layer, in accordance with an embodiment of the present invention.

FIG. 11 is a cross-sectional side view showing a dielectric plug layer formed on the power rail cap between the protective liners and on the reduced height portions of the fill layer, in accordance with an embodiment of the present invention.

In one or more embodiments, a dielectric plug layer 220 can be formed on the power rail cap 215 between the protective liners 192 and on the reduced height portions of the fill layer 170. The dielectric plug layer 220 can be formed by a conformal deposition, a blanket deposition, or a combination thereof. The dielectric plug layer 220 can fill up the power rail trench 205, and a CMP can be used to remove excess material. The top surfaces of the stack templates 160 can be exposed.

In various embodiments, the dielectric plug layer 220 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof. The dielectric plug layer 220 can be the same dielectric material as the fill layer 170.

Figure 12:
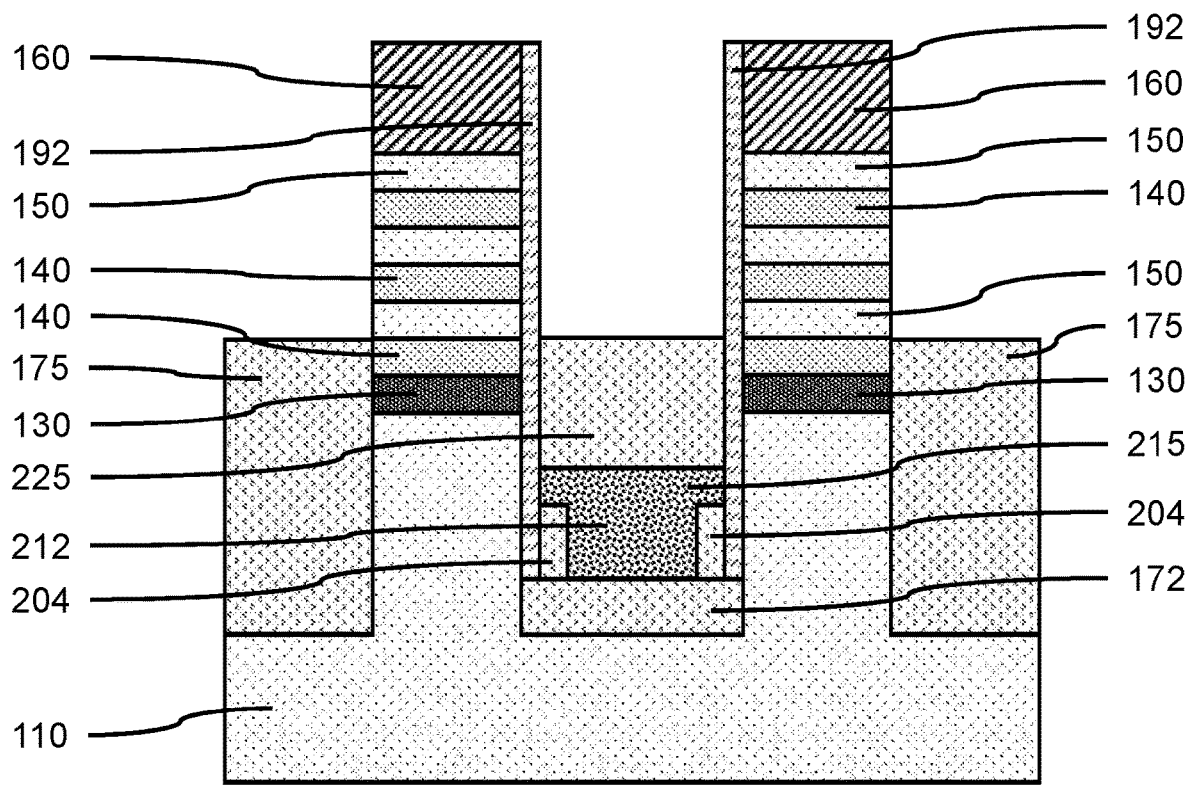
FIG. 12 is a cross-sectional side view showing the heights of the dielectric plug and the fill layer reduced to expose portions of some of the nanosheet layers, in accordance with an embodiment of the present invention.

FIG. 12 is a cross-sectional side view showing the heights of the dielectric plug and the fill layer reduced to expose portions of some of the nanosheet layers, in accordance with an embodiment of the present invention.

In one or more embodiments, the heights of the dielectric plug layer 220 and the fill layer 170 can be reduced to expose portions of some of the nanosheet layers 140, 150. The heights of the dielectric plug layer 220 and the fill layer 170 can be reduced using a selective, isotropic etch, for example, a wet chemical etch or dry plasma etch, to form a reduced height fill layer 175 and a dielectric plug 225. One or more nanosheet layers 140, 150 can remain covered by the reduced height fill layer 175. A portion of the protective liners 192 can be exposed by formation of the dielectric plug 225.

Figure 13:
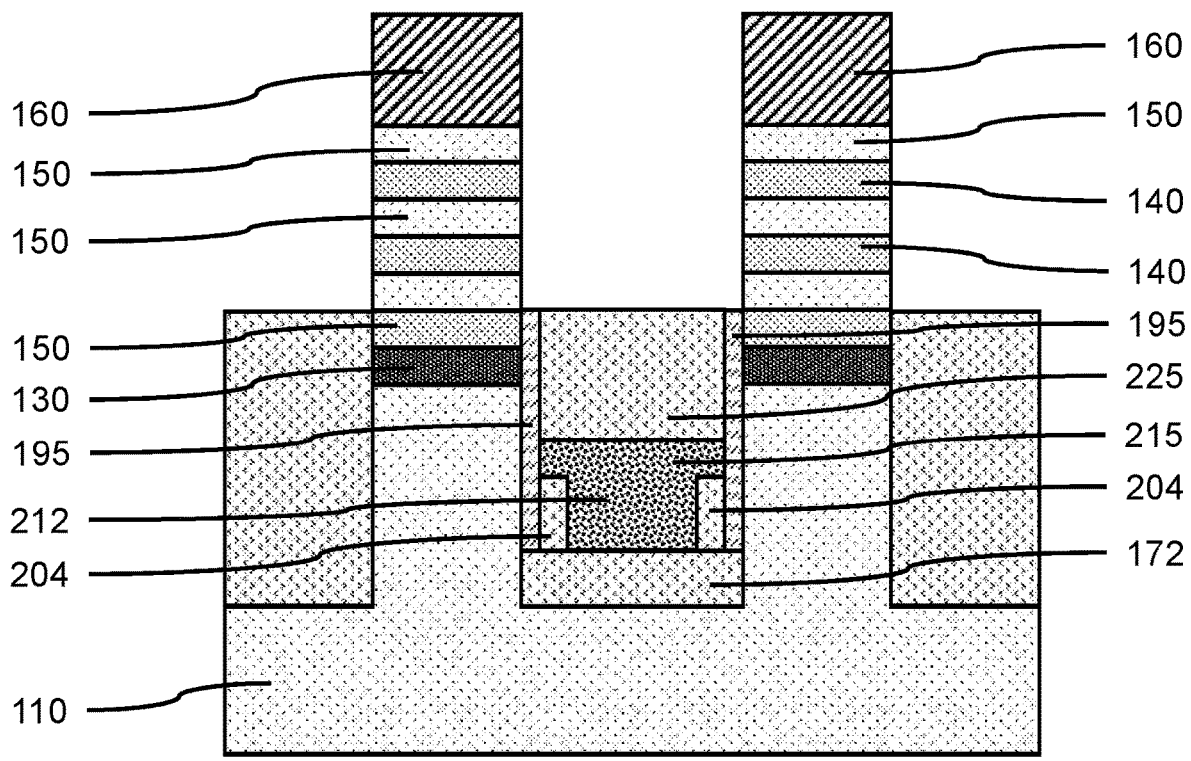
FIG. 13 is a cross-sectional side view showing the exposed portions of the protective liners removed from the nanosheet stack templates and nanosheet stacks, in accordance with an embodiment of the present invention.

FIG. 13 is a cross-sectional side view showing the exposed portions of the protective liners removed from the nanosheet stack templates and nanosheet stacks, in accordance with an embodiment of the present invention.

In one or more embodiments, the exposed portions of the protective liners 192 can be removed from the nanosheet stack templates 160 and exposed nanosheet layers 140, 150, where the exposed portions of the protective liners 192 can be removed using a selective isotropic etch (e.g., wet chemical etch or dry plasma etch) to form protective liner segments 195. The top edges of the protective liner segments 195 can be coplanar with the top surface of the dielectric plug 225.

Figure 14:
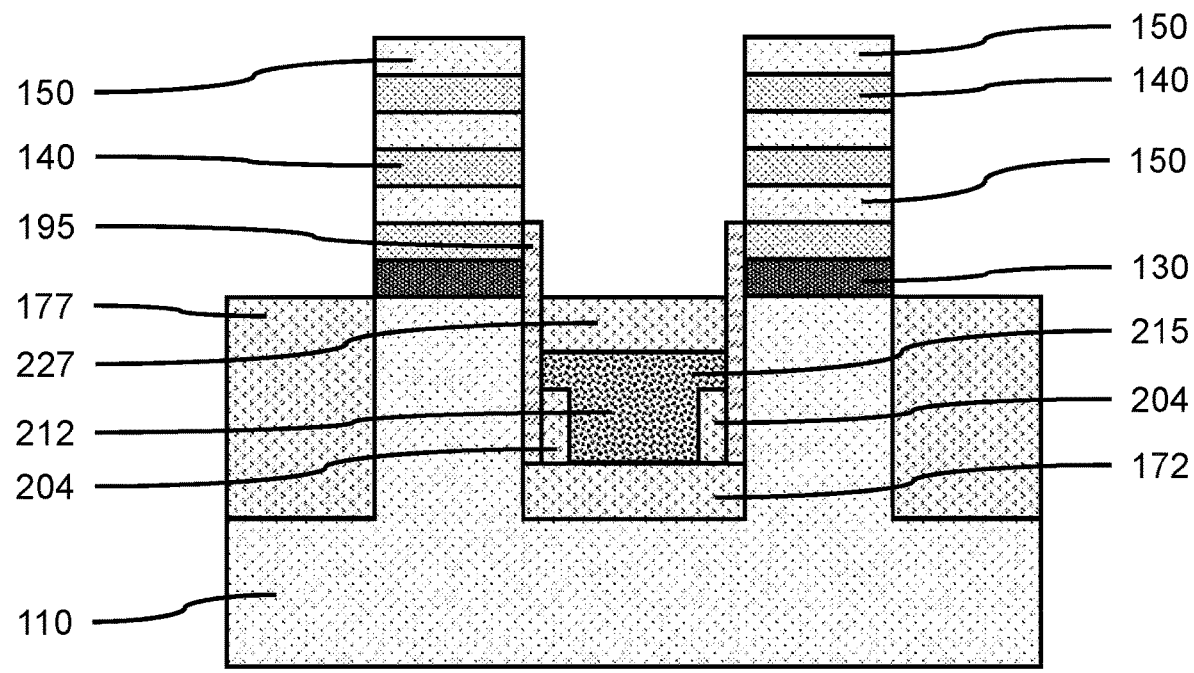
FIG. 14 is a cross-sectional side view showing the heights of the dielectric plug and the fill layer further reduced to expose portions of the protective liner segments and bottom sacrificial layers, in accordance with an embodiment of the present invention.

FIG. 14 is a cross-sectional side view showing the heights of the dielectric plug and the fill layer further reduced to expose portions of the protective liner segments and bottom sacrificial layers, in accordance with an embodiment of the present invention.

In one or more embodiments, the heights of the dielectric plug 225 and the reduced height fill layer 175 can be further reduced to expose further portions of the protective liner segments 195 and bottom sacrificial layers 130. Reducing the height of the dielectric plug 225 forms a dielectric slab 227 on the power rail cap 215 and protective liner segments 195. In various embodiments, the top surface of the dielectric slab 227 can be coplanar or below the interface of the bottom sacrificial layers 130 with the respective device pillars 120. The further reduced height fill layer 175 can form a lower fill layer 177 with a top surface approximately coplanar with the top of the dielectric slab.

In one or more embodiments, the nanosheet stack template 160 can be removed using a selective etch to expose the top-most channel nanosheet(s) 150.

Figure 15:
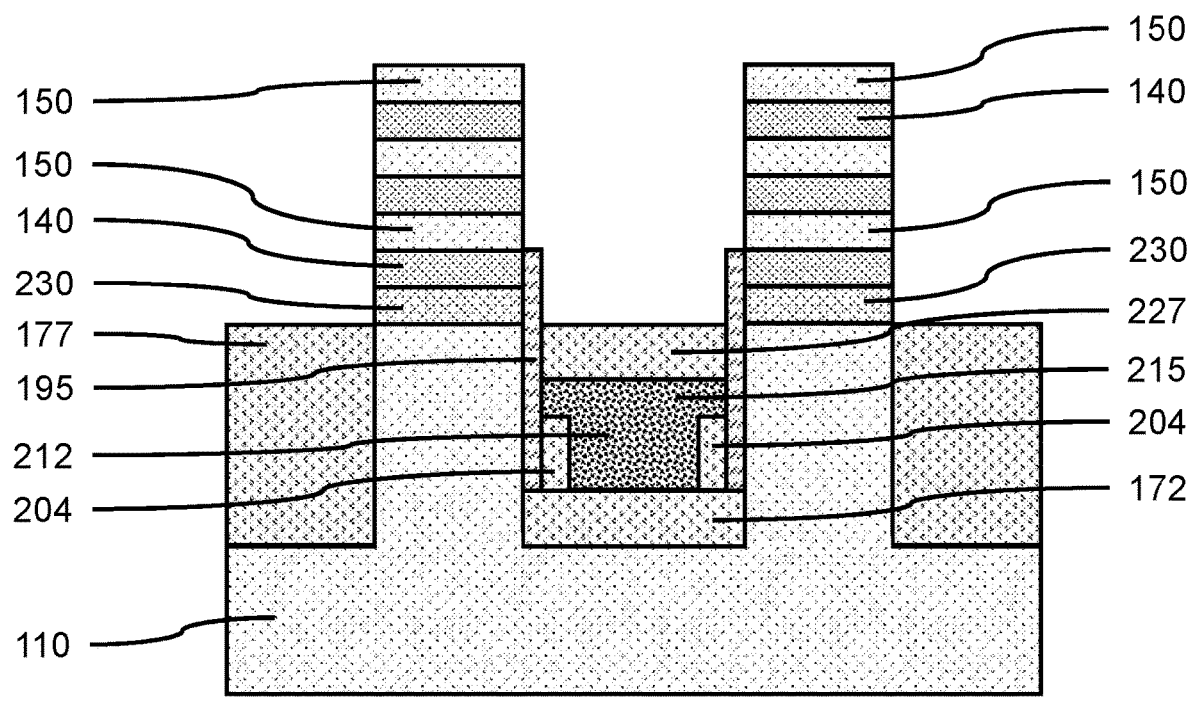
FIG. 15 is a cross-sectional side view showing the replacement of the bottom sacrificial layers with a bottom isolation layer, in accordance with an embodiment of the present invention.

FIG. 15 is a cross-sectional side view showing the replacement of the bottom sacrificial layers with a bottom isolation layer, in accordance with an embodiment of the present invention.

In one or more embodiments, the bottom sacrificial layers 130 can be removed using a selective isotropic etch. The nanosheet layers 140, 150 can remain supported by portions of a dummy gate structure.

In one or more embodiments, the space previously occupied by the bottom sacrificial layers 130 can be filled to form a bottom isolation layer 230, where the bottom isolation layer 230 can be formed by a conformal deposition, for example, atomic layer deposition (ALD), followed by a selective isotropic etch back.

In various embodiments, the bottom isolation layer 230 can be a dielectric material, including, but not limited to, silicon nitride (SiN), silicon boro carbonitride (SiBCN), silicon oxy carbonitride (SiOCN), silicon oxycarbide (SiCO), and combinations thereof.

Figure 16:
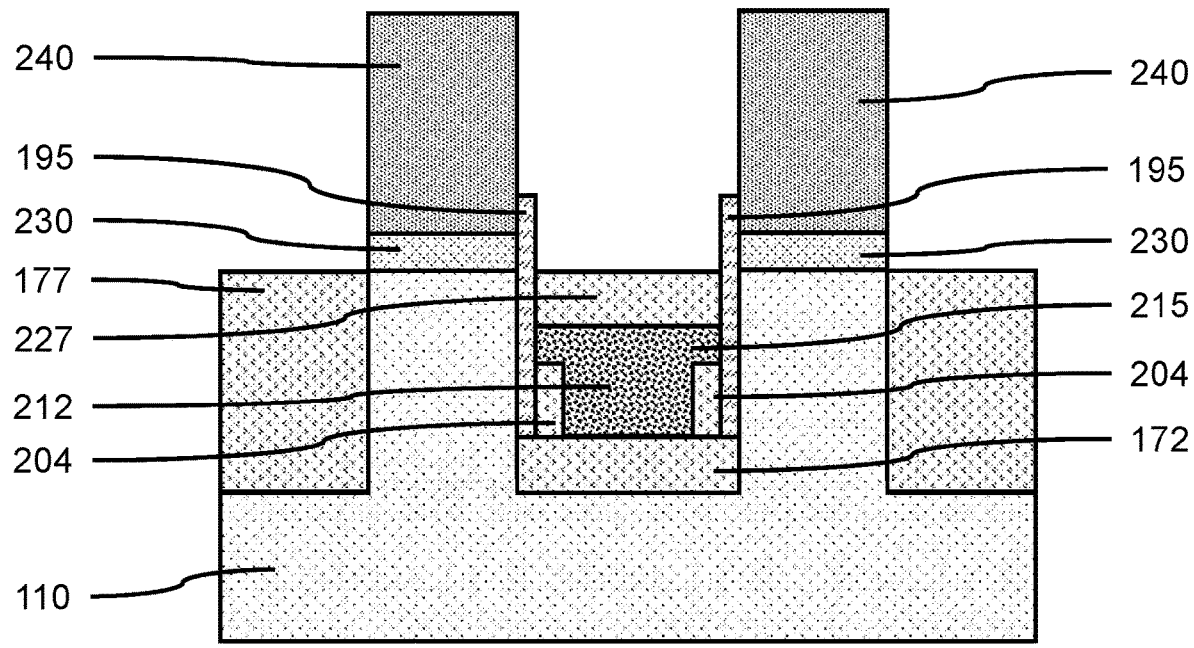
FIG. 16 is a cross-sectional side view showing the formation of source/drains on the nanosheet layer and bottom isolation layer, in accordance with an embodiment of the present invention.

FIG. 16 is a cross-sectional side view showing the formation of source/drains on the nanosheet layer and bottom isolation layer, in accordance with an embodiment of the present invention.

In one or more embodiments, source/drains 240 can be formed on the nanosheet layers 140, 150 and bottom isolation layer 230, where the source/drains 240 can be formed by epitaxial growth on the alternating sacrificial nanosheets 140 and channel nanosheets 150. In various embodiments, source/drains 240 can be formed on vertical fins of a fin type transistor device.

In various embodiments, the source/drains 240 can be, for example, phosphorus doped silicon (Si) for an n-type device, or boron doped silicon germanium (SiGe) for a p-type device.

Figure 17:
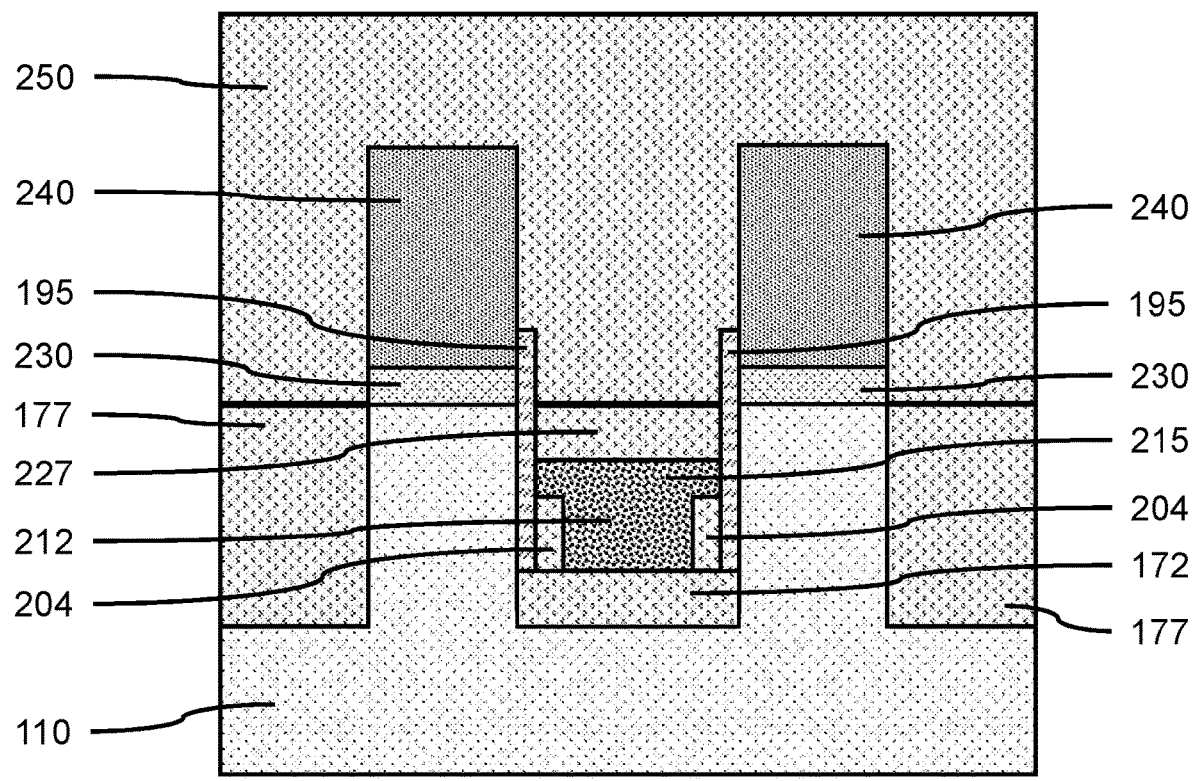
FIG. 17 is a cross-sectional side view showing the formation of an upper fill layer on the lower fill layer and dielectric slab, in accordance with an embodiment of the present invention.

FIG. 17 is a cross-sectional side view showing the formation of an upper fill layer on the lower fill layer and dielectric slab, in accordance with an embodiment of the present invention.

In one or more embodiments, an upper fill layer 250 can be formed on the lower fill layer 177 and dielectric slab 227, where the upper fill layer 250 can be formed by a blanket deposition.

In various embodiments, the upper fill layer 250 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof. The upper fill layer 250 can be the same dielectric material as the lower fill layer 177. The upper fill layer 250 can extend above the top surfaces of the source/drains 240.

Figure 18:
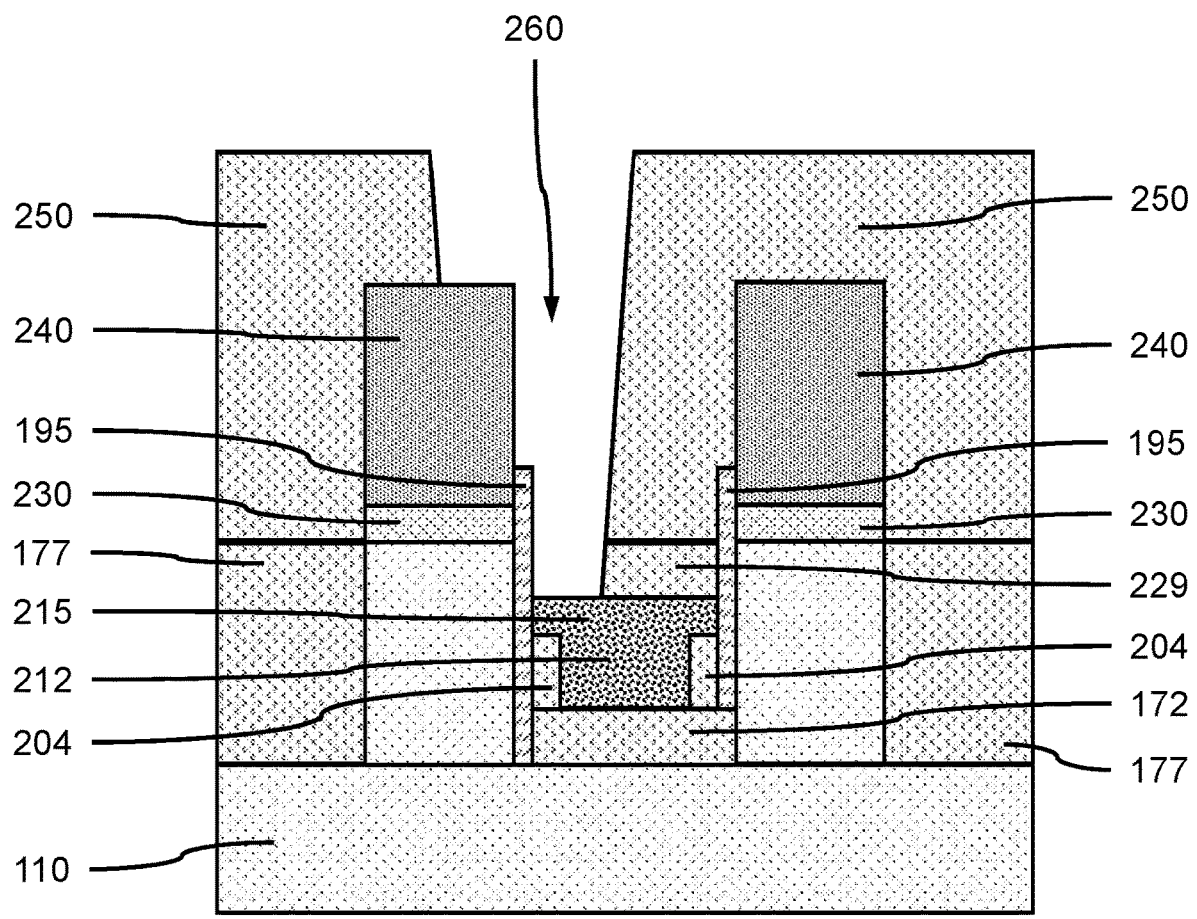
FIG. 18 is a cross-sectional side view showing the formation of a contact trench in the upper fill layer and dielectric slab that exposes portions of a source/drain and power rail cap, in accordance with an embodiment of the present invention.

FIG. 18 is a cross-sectional side view showing the formation of a contact trench in the upper fill layer and dielectric slab that exposes portions of a source/drain and power rail cap, in accordance with an embodiment of the present invention.

In one or more embodiments, a contact trench 260 can be formed in the upper fill layer 250 that exposes portions of a source/drain 240 of one of the adjacent device cells 50 and the power rail cap 215 between the two adjacent device cells 50. The contact trench 260 can be formed using lithographic techniques and etching, where a portion of the dielectric slab 227 can be removed to expose the power rail cap 215, and form a dielectric section 229.

Figure 19:
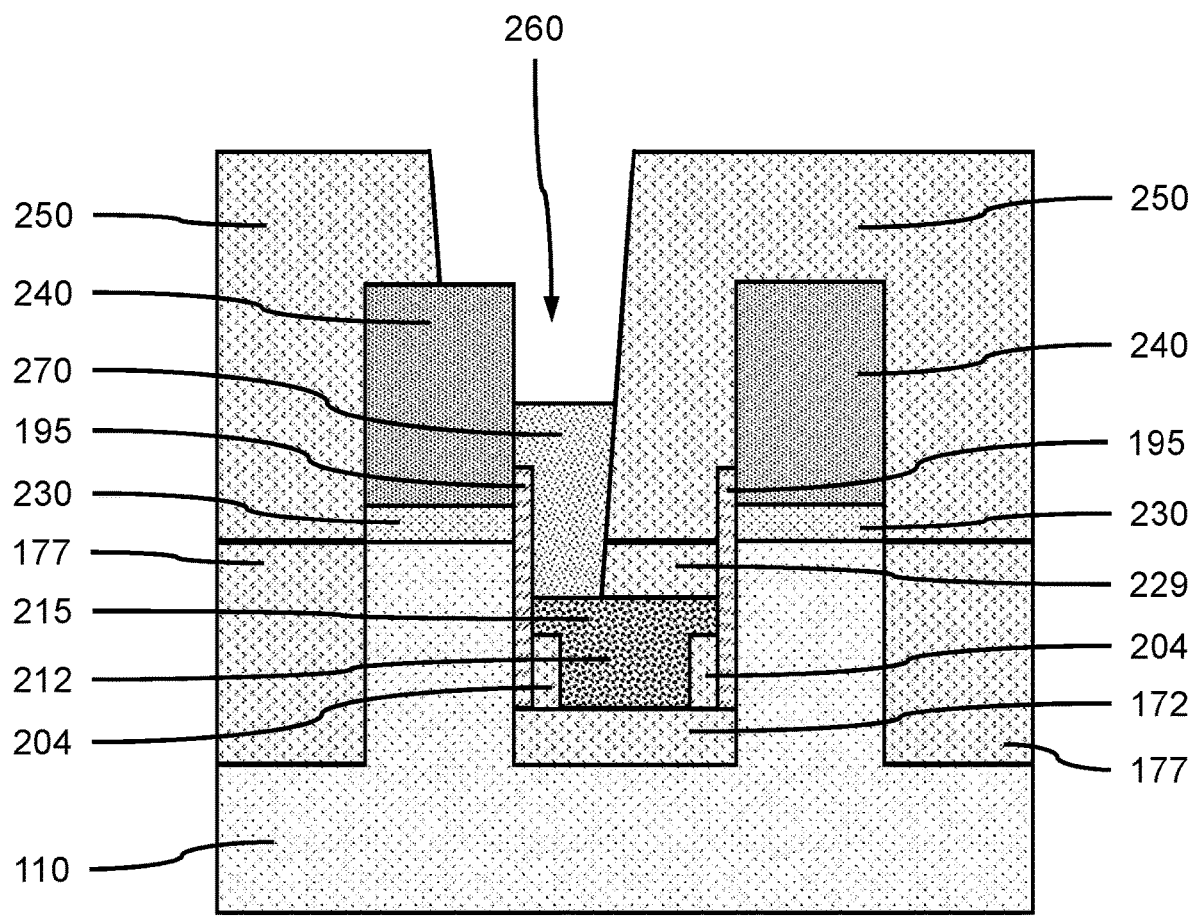
FIG. 19 is a cross-sectional side view showing the formation of a buried contact on the source/drain, protective liner, and power rail cap, in accordance with an embodiment of the present invention.

FIG. 19 is a cross-sectional side view showing the formation of a buried contact on the source/drain, protective liner segment, and power rail cap, in accordance with an embodiment of the present invention.

In one or more embodiments, a buried contact 270 can be formed on the exposed portion of the source/drain 240, protective liner segment 195, and power rail cap 215, where the buried contact 270 can be formed by a metal deposition and an etch back. The dielectric section 229 can cover a portion of the power rail cap 215 not in contact with the buried contact 270. The buried contact 270 can be formed by conformal deposition, and/or a blanket deposition, and an etch-back to a predetermined height below the top of the source/drain 240.

Figure 20:
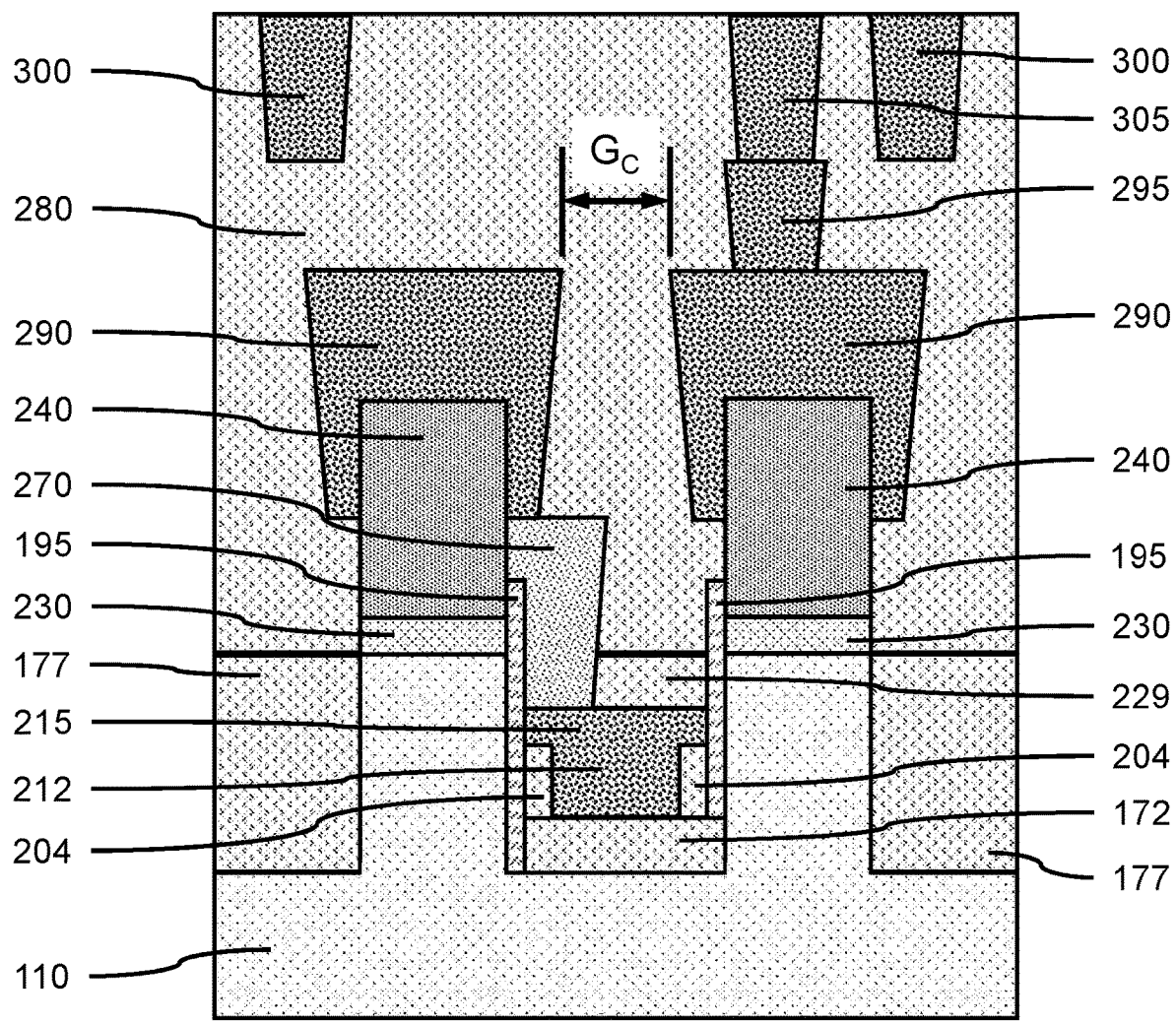
FIG. 20 is a cross-sectional side view showing the formation of the metal lines of the metallization layer on the buried contact and the source/drains with a larger tip-to-tip distance, in accordance with an embodiment of the present invention.

FIG. 20 is a cross-sectional side view showing the formation of the metal lines of the metallization layer on the buried contact and the source/drains with a larger tip-to-tip distance, in accordance with an embodiment of the present invention.

In one or more embodiments, the contact trench 260 can be filled in by an interlayer dielectric (ILD) layer 280, where the ILD layer 280 can be formed by a blanket deposition. The ILD layer 280 can be formed on the upper fill layer 250, where the ILD layer 280 and upper fill layer 250 can be the same dielectric material.

In various embodiments, the interlayer dielectric (ILD) layer 280 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof. A low-k dielectric material can be, for example, fluorine doped silicon oxide (SiO:F), carbon doped silicon oxide (SiO:C), hydrogen silsesquioxane (HSQ), methylsilsesquioxane (MSQ), tetraethoxysilane (TEOS), and combinations thereof.

In one or more embodiments, trenches and vias can be formed in the interlayer dielectric (ILD) layer 280 for conductive device contacts 290 and metal lines of a metallization layer. The trenches can be aligned with the source/drains 240, and conductive device contacts 290 can be formed to source/drains 240 on adjacent transistor devices, where the conductive device contacts 290 can be a suitable conducting material. Additional metal vias 295 and connections 300, 305 that can electrically connect devices and supply power to the transistor devices in device cells 50 can be formed in the ILD layer 280. The metal via 295 can connect a conductive device contacts 290, electrically connected to a source/drain 240, to a metal line 305. Connections 300, 305 can be signal lines connected to the transistor devices.

In various embodiments, the tip-to-tip distance, $G_C$, between adjacent conductive device contacts 290 can be in a range of about 20 nm to about 50 nm, or about 25 nm to about 40 nm, where the tip-to-tip distance, $G_C$, is larger than a lithographically printable minimum of about 20 nm.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper." and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a buried power rail for transistor devices, comprising:
   forming an adjacent pair of transistor devices on a substrate, wherein the adjacent pair of transistor devices is separated by a gap distance, $G_D$, filled by a fill layer;
   forming a dielectric plate between the adjacent pair of transistor devices by removing a portion of the fill layer to expose at least a portion of the sidewalls of the adjacent pair of transistor devices;
   forming a sidewall spacer on each of the adjacent pair of transistor devices;
   forming the buried power rail on the dielectric plate and between the sidewall spacers;
   removing a portion of the sidewall spacers above the buried power rail to form spacer bars on the dielectric plate; and
   forming a power rail cap on the buried power rail and spacer bars.

2. The method of claim 1, further comprising, forming a dielectric plug layer on the power rail cap, wherein the power rail cap is over a top surface of each of the spacer bars, and etching back the dielectric plug layer to form a dielectric plug between the adjacent pair of transistor devices.

3. The method of claim 2, further comprising, reducing the height of the dielectric plug to form a dielectric slab on the power rail cap.

4. The method of claim 3, further comprising, forming an upper fill layer on the dielectric slab and between the adjacent pair of transistor devices.

5. The method of claim 4, further comprising, forming a contact trench in the upper fill layer that exposes a portion of the power rail cap.

6. The method of claim 5, further comprising, forming a buried contact on the exposed portion of the power rail cap.

7. The method of claim 6, further comprising forming a conductive device contact on each of the adjacent pair of transistor devices.

8. The method of claim 6, wherein a tip-to-tip distance, $G_C$, between the conductive device contacts is in a range of about 20 nm to about 50 nm.

9. A method of forming a buried power rail for transistor devices, comprising:
   forming an adjacent pair of transistor devices on a substrate, wherein the adjacent pair of transistor devices is separated by a gap distance, $G_D$, filled by a fill layer;
   forming a dielectric plate between the adjacent pair of transistor devices by removing a portion of the fill layer;
   forming a sidewall spacer on each of the adjacent pair of transistor devices, wherein a portion of the dielectric plate is exposed between the sidewall spacers;
   forming a buried power rail on the dielectric plate and between the sidewall spacers;
   removing a portion of the sidewall spacers above the buried power rail to form spacer bars on the dielectric plate;
   forming a metal power rail cap on the buried power rail and spacer bars;
   forming a dielectric slab on the metal power rail cap; and
   forming a source/drain on each of the adjacent pair of transistor devices.

10. The method of claim 9, wherein the gap distance, $G_D$, is in a range of about 30 nanometers (nm) to about 150 nm.

11. The method of claim 10, further comprising forming a conductive device contact on each of the source/drains.

12. The method of claim 11, wherein a tip-to-tip distance, $G_C$, between the conductive device contacts is in a range of about 20 nm to about 50 nm.

13. A method of forming a buried power rail for transistor devices, comprising:
    forming an adjacent pair of transistor devices on a substrate, wherein the adjacent pair of transistor devices is separated by a gap distance, $G_D$, filled by a fill layer;
    forming a dielectric plate between the adjacent pair of transistor devices by removing a portion of the fill layer;
    forming a protective liner on each of the adjacent pair of transistor devices;
    forming a sidewall spacer on each of the protective liners;
    forming a buried power rail on the dielectric plate and between the sidewall spacers;
    removing a portion of the sidewall spacers above the buried power rail to form spacer bars on the dielectric plate;
    forming a power rail cap on the buried power rail and spacer bars;
    forming a dielectric plug on the power rail cap between the protective liners;
    removing a portion of the protective liners above the dielectric plug to form protective liner segments; and
    reducing the height of the dielectric plug to form a dielectric slab on the power rail cap.

14. The method of claim 13, wherein the dielectric plug is formed by depositing a dielectric plug layer on the power rail cap, and etching back the dielectric plug layer to form the dielectric plug.

15. The method of claim 13, wherein the portion of the fill layer removed to form the dielectric plate also exposes at least a portion of the sidewalls of the adjacent pair of transistor devices.

16. The method of claim 13, wherein a top surface of the dielectric plate is exposed between the sidewall spacers before forming the buried power rail.

17. The method of claim 16, further comprising, forming an upper fill layer on the dielectric slab and protective liner segments.

18. The method of claim 17, wherein the protective liners are a dielectric material selected from the group consisting of silicon carbide (SiC), silicon oxycarbide (SiOC), and a combination thereof.

19. The method of claim 17, wherein the power rail cap is over a top surface of each of the spacer bars, and wherein the power rail cap is made of a metal.

* * * * *